(12) United States Patent
Lu et al.

(10) Patent No.: US 10,044,061 B2
(45) Date of Patent: Aug. 7, 2018

(54) METHODS FOR GROWTH OF LITHIUM-RICH ANTIPEROVSKITE ELECTROLYTE FILMS AND USE THEREOF

(71) Applicants: Los Alamos National Security, LLC, Los Alamos, NM (US); Board of Regents of the Nevada System of Higher Education, on behalf of the University of Nevada, Las Vegas, NV, Las Vegas, NV (US)

(72) Inventors: Xujie Lu, Los Alamos, NM (US); John Howard, Las Vegas, NV (US); Luc Daemen, Oak Ridge, TN (US); Yusheng Zhao, Las Vegas, NV (US); Quanxi Jia, Los Alamos, NM (US)

(73) Assignee: Los Alamos National Security, LLC, Los Alamos, NM (US)

( * ) Notice: Subject to any disclaimer, the term of this patent is extended or adjusted under 35 U.S.C. 154(b) by 21 days.

(21) Appl. No.: 14/736,109

(22) Filed: Jun. 10, 2015

(65) Prior Publication Data
US 2015/0364788 A1 Dec. 17, 2015

Related U.S. Application Data

(60) Provisional application No. 62/010,904, filed on Jun. 11, 2014.

(51) Int. Cl.
*H01M 10/0562* (2010.01)
*H01M 10/0525* (2010.01)
(Continued)

(52) U.S. Cl.
CPC ..... *H01M 10/0562* (2013.01); *C04B 35/5152* (2013.01); *C04B 35/553* (2013.01);
(Continued)

(58) Field of Classification Search
CPC .................. C04B 35/5152; C04B 35/553
See application file for complete search history.

(56) References Cited

U.S. PATENT DOCUMENTS

2011/0151283 A1* 6/2011 Gillaspie ............... G02F 1/1525
429/7
2012/0260478 A1* 10/2012 Kuriki ................. H01M 4/1391
29/25.03
2013/0202971 A1 8/2013 Zhao et al.

FOREIGN PATENT DOCUMENTS

WO WO 2012112229 A2 * 8/2012 ........ H01M 10/0562

OTHER PUBLICATIONS

Sakuda (Journal of Power Sources 196 (2011) 6735-6741).*
(Continued)

*Primary Examiner* — Joel G Horning
(74) *Attorney, Agent, or Firm* — Klarquist Sparkman, LLP (57) ABSTRACT

A process for preparing a lithium-rich antiperovskite electrolyte film involves forming a composite target of precursor metal oxide(s) and metal halide(s), and exposing the target to a pulsed laser beam under conditions suitable for depositing a film of lithium-rich antiperovskite on a surface. In some embodiments the process is used to prepare a film of $Li_3OCl$ from a target largely composed of $Li_2O$ and $LiCl$. Exposure of the target to a pulsed laser beam deposits antiperovskite electrolyte $Li_3OCl$ on a substrate. In another embodiment, sputtering may be used to prepare films of lithium-rich antiperovskites using the composite target of precursor metal oxide(s) and metal halide(s).

20 Claims, 3 Drawing Sheets

(51) Int. Cl.
*C23C 14/28* (2006.01)
*C04B 35/515* (2006.01)
*C04B 35/553* (2006.01)
*C23C 14/06* (2006.01)
*H01B 1/06* (2006.01)

(52) U.S. Cl.
CPC .............. *C23C 14/06* (2013.01); *C23C 14/28* (2013.01); *H01B 1/06* (2013.01); *H01M 10/0525* (2013.01); *C04B 2235/3203* (2013.01); *C04B 2235/3206* (2013.01); *C04B 2235/3208* (2013.01); *C04B 2235/3213* (2013.01); *C04B 2235/3215* (2013.01); *C04B 2235/3217* (2013.01)

(56) References Cited

OTHER PUBLICATIONS

Dijkkamp, et al., "Preparation of Y—Ba—Cu Oxide Superconductor Thin Films Using Pulsed laser Evaporation from High $T_c$ Bulk Material," *Appl. Phys. Lett.*, 51 (8), 619-621 (1987).

* cited by examiner

METHODS FOR GROWTH OF LITHIUM-RICH ANTIPEROVSKITE ELECTROLYTE FILMS AND USE THEREOF

CROSS REFERENCE TO RELATED APPLICATION

This application claims the benefit of the earlier filing date of U.S. Provisional Application No. 62/010,904, filed Jun. 11, 2014, which is incorporated in its entirety herein by reference.

ACKNOWLEDGMENT OF GOVERNMENT SUPPORT

This invention was made with government support under Contract No. DE-AC52-06NA25396 awarded by the U.S. Department of Energy. The government has certain rights in the invention.

FIELD

Disclosed are methods for the preparation of films of antiperovskites by pulsed laser deposition ("PLD") using a target that is a pressed mixture of precursor powders, and also to processes for preparing multilayered articles that include films of antiperovskites prepared by PLD using the target.

BACKGROUND

Lithium ion batteries have a high energy density, power capacity, charge-discharge rate, endurance, and/or cycling lifetime. Typical lithium ion batteries include liquid electrolytes of lithium salts dissolved in solvents. The liquid electrolytes are often toxic, corrosive, and/or flammable.

Solid electrolytes based on solid lithium-rich antiperovskites having ionic conductivities ("$\sigma$") of greater than $10^{-3}$ S/cm at room temperature and activation energies of 0.2-0.3 eV have been reported recently. The lithium-rich antiperovskite $Li_3OCl$, for example, has been prepared by grinding together (i.e., ball-milling) LiOH and LiCl and then sintering the ball-milled mixture in a quartz tube at 300-360° C. under vacuum for several days to form $Li_3OCl$. The melt that forms in the quartz tube is cooled to room temperature to afford $Li_3OCl$ having different microstructures. The procedure is repeated several times to ensure complete reaction and product uniformity. The prepared $Li_3OCl$ is used to prepare $Li_3OCl$ films on surfaces by pulsed laser deposition ("PLD"). A major disadvantage of this method is that the $Li_3OCl$ is unstable in air and reacts with the atmosphere even during transfer to the PLD apparatus.

SUMMARY

An embodiment relates to a process for preparing a film of an antiperovskite material on a surface, comprising: providing a target comprising a mixture of precursors, the ratio of atoms present in the precursors chosen to provide a desired ratio of atoms present in a chosen antiperovskite material, and thereafter exposing the target to a pulsed laser beam under conditions suitable for deposition of the antiperovskite material on the surface. The step of providing the target may include compressing the mixture of precursors into a pressed object and annealing the pressed object at an effective temperature for an effective period of time to physically stabilize the pressed object without converting more than 10 wt % of the mixture of precursors into an antiperovskite phase.

An embodiment relates to a process for preparing a film of $Li_3OCl$. The process comprises providing a target comprising a mixture of $Li_2O$ and LiCl, the mixture having a molar ratio of $Li_2O$:LiCl within a range of 0.9:1.1 and 1.1:0.9, and exposing the target to a pulsed laser beam under conditions suitable for depositing a film comprising $Li_3OCl$ on a substrate.

Another embodiment relates to a process for preparing a multilayered article. The process includes depositing a layer of metal on a substrate; exposing a target comprising a mixture of $Li_2O$ and LiCl, the mixture having a molar ratio of $Li_2O$:LiCl within a range of 0.9:1.1 and 1.1:0.9, to a pulsed laser beam under conditions suitable for depositing a film comprising antiperovskite $Li_3OCl$ on the first layer of metal; depositing a second layer of metal on the layer comprising antiperovskite $Li_3OCl$, and, optionally, depositing a protective layer on the second layer of metal.

The foregoing and other objects, features, and advantages of the invention will become more apparent from the following detailed description, which proceeds with reference to the accompanying figures.

DETAILED DESCRIPTION

Disclosed herein are processes for preparing antiperovskite films, such as films of antiperovskite electrolytes, from a composite target comprising a mixture of precursor powders. The disclosed process eliminates prior art disadvantages such as the complex procedure used to form a target comprising the antiperovskite compound prior to film deposition and/or the instability of an antiperovskite-containing target when exposed to the atmosphere.

The term "antiperovskite" may be understood in relation to an explanation of what a normal perovskite is. A normal perovskite may have a composition of the formula $ABX_3$ wherein A is a $2^+$ cation, B is a $4^+$ cation, and X is a $2^-$ anion (typically $O^{2-}$, and is characterized by corner-sharing $BX_6$ octahedra that may be tilted (lower symmetry orthorhombic/tetragonal/hexagonal unit cell) or untilted (high symmetry cubic unit cell). A traditional perovskite has a perovskite crystal structure, which is a well-known crystal structure.

An antiperovskite composition also has the formula $ABX_3$, but in contrast to a normal perovskite, A and B in an antiperovskite are the anions and X is the cation. For example, the antiperovskite $ABX_3$ having the chemical formula $ClOLi_3$ has a perovskite crystal structure but the A (i.e., chloride) is an anion, the B (oxide) is an anion, and X (i.e., lithium) is a cation. $ClOLi_3$ can be rewritten as $Li_3OCl$.

I. Definitions and Abbreviations

The following explanations of terms and abbreviations are provided to better describe the present disclosure and to guide those of ordinary skill in the art in the practice of the present disclosure. As used herein, "comprising" means "including" and the singular forms "a" or "an" or "the" include plural references unless the context clearly dictates otherwise. The term "or" refers to a single element of stated alternative elements or a combination of two or more elements, unless the context clearly indicates otherwise.

Unless explained otherwise, all technical and scientific terms used herein have the same meaning as commonly understood to one of ordinary skill in the art to which this disclosure belongs. Although methods and materials similar or equivalent to those described herein can be used in the practice or testing of the present disclosure, suitable methods and materials are described below. The materials, methods, and examples are illustrative only and not intended to be limiting. Other features of the disclosure are apparent from the following detailed description and the claims.

Unless otherwise indicated, all numbers expressing quantities of components, properties such as molecular weight, percentages, and so forth, as used in the specification or claims are to be understood as being modified by the term "about." Unless otherwise indicated, non-numerical properties such as crystalline, homogeneous, and so forth as used in the specification or claims are to be understood as being modified by the term "substantially," meaning to a great extent or degree. Accordingly, unless otherwise indicated, implicitly or explicitly, the numerical parameters and/or non-numerical properties set forth are approximations that may depend on the desired properties sought, limits of detection under standard test conditions/methods, limitations of the processing method, and/or the nature of the parameter or property. When directly and explicitly distinguishing embodiments from discussed prior art, the embodiment numbers are not approximates unless the word "about" is recited.

In order to facilitate review of the various embodiments of the disclosure, the following explanations of specific terms are provided:

Anneal: A process in which a material is heated to a specified temperature for a specified period of time and then cooled. As used herein, the term "anneal" refers to heating at an effective temperature for an effective period of time to form a structure that is sufficiently intact for handling, e.g., during transfer to a pulsed laser deposition apparatus.

Antiperovskite: A composition having a perovskite crystal structure and the general formula $ABX_3$, where A and B are monovalent and divalent anions, respectively, and X is a cation, e.g., an alkali metal. In an idealized cubic cell structure, A is at the center of the cube, B anions are at the corners of the cube, and X cations in the face centers of the cube. Some antiperovskite compounds have orthorhombic and/or tetragonal phases.

Powder: A composition comprising dispersed solid particles that are relatively free flowing from one another.

Precursor: An initial compound that participates in a chemical reaction to form another compound.

Target: As used here, the term "target" refers to a solid object formed by compressing a powder with sufficient pressure to form the solid object (e.g., a disk) that is sufficiently intact to withstand handling during subsequent transfer to a pulsed laser deposition apparatus. The term "composite target" refers to a target comprising two or more precursor materials used to form a desired antiperovskite material.

II. Preparation of Composite Targets

Conventionally, an antiperovskite film is prepared by pulsed laser deposition using a compound target of the desired product material, e.g., $Li_3OCl$. In previous methods for preparing antiperovskite films, precursor mixtures of metal oxides and metal halides are subjected to a grinding and mixing procedure known in the art as ball-milling, followed by sintering the ball-milled powder mixture in a quartz tube at high temperatures for several days to form the product material, e.g., $Li_3OCl$. The $Li_3OCl$ product is formed into a target, which is then used for pulsed laser deposition of an antiperovskite film of the same chemical composition. Aside from the lengthy and difficult process of preparing the $Li_3OCl$, the compound target is not stable in air. Thus, the compound target is prepared fresh and/or stored in an inert atmosphere such as in a glove-box containing an inert atmosphere. Even so, the target surface begins to react with the atmosphere when transferring the compound target from the glove-box to a pulsed laser deposition apparatus or sputtering apparatus.

The inventors surprisingly discovered that a composite target comprising precursors of an antiperovskite material could be used to prepare a film of an antiperovskite material on a surface, thereby eliminating the arduous procedure of making a compound, or product material, target for use in a PLD or sputtering process. For example, a composite target comprising $Li_2O$ and $LiCl$ can be used to prepare an antiperovskite film of $Li_3OCl$. Advantageously, the precursors $Li_2O$ and $LiCl$ are much more stable in air than $Li_3OCl$. Thus, the composite target comprising $Li_2O$ and $LiCl$ is much more stable in air than a compound target comprising $Li_3OCl$.

A general embodiment of a process for preparing a film of an antiperovskite material on a substrate surface includes providing a composite target comprising a mixture of precursors. The composite target is exposed to a pulsed laser beam under conditions suitable for deposition of a film of the antiperovskite material on the surface. In some embodiments, the ratio of the atoms present in the precursors is chosen to be the same as the desired ratio of the atoms present in the resulting antiperovskite material, e.g., a 1:1 molar ratio of $Li_2O$ and $LiCl$ may be used to prepare $Li_3OCl$. Slight variations in the stoichiometric ratio, e.g., 5-10 mol %, may be tolerated without adverse effect (e.g., presence of unreacted precursors in the resulting antiperovskite material). Thus, a molar ratio within a range of 0.9:1.1 to 1.1:0.9, such as within a range of 0.95:1:05 to 1.05:0.95, may be suitable.

The composite target is prepared by compressing a mixture of the precursors into a pressed object and annealing the pressed object under temperature and time conditions that are effective to physically stabilize the pressed object (e.g., conditions effective to provide a pressed object that is sufficiently intact for handling during the subsequent transfer to a PLD apparatus and during the PLD process) but do not substantially promote a reaction amongst the precursors that would convert the precursors to the antiperovskite material within the composite target. Thus, the annealing may result in conversion of no more than 10 weight percent of the precursor mixture into the antiperovskite product (e.g., $Li_3OCl$), leaving at least 90 wt % of the target composed of the starting precursors. In some embodiments, the composite target comprises 90-100 wt %, 93-100 wt %, 95-100 wt %, 97-100 wt %, or 99-100 wt % precursors. The percentages of antiperovskite material and precursor compounds in the composite target may be determined by any suitable method; for example, the molar ratios may be determined by x-ray diffraction after the composite target has been annealed.

The composite target may be prepared from powders of the precursor materials. Desirably the precursor materials are substantially pure (e.g., a purity of at least 95 wt %) to minimize contamination in the resulting antiperovskite material. The particle size is not critical. In some embodiments, the powder has an average particle size of less than 0.5 mm, less than 0.30 mm, or less than 0.25 mm. The precursor powders are mixed by any suitable means (e.g., stirring, shaking, grinding, milling) to provide a precursor mixture. Because the conditions chosen for annealing a pressed target of precursor powders do not result in substantial reaction of the powders, some degree of inhomogeneity in the composite disk is tolerated.

In some embodiments, the precursor mixture is compressed to form a composite disk at a pressure of at least 5 MPa, such as a pressure within a range of 5-40 MPa, 10-40 MPa, or 20-40 MPa. Effective annealing conditions include heating the pressed object at a temperature≥200° C., such as a temperature within a range of 200-750° C., 200-650° C., 300-650° C., or 300-450° C. The timeframe is not a critical factor. In some embodiments, annealing is performed for 1-24 hours, such as for 1-12 hours or 3-8 hours. In some embodiments, the steps of compressing and annealing are performed concurrently. In other embodiments, the target disk is compressed and then subsequently annealed. The target may be annealed in an inert atmosphere. For example, the target may be annealed in an argon atmosphere.

In one embodiment, a composite target comprising $Li_2O$ and LiCl was prepared under a pressure of 20-30 MPa within a temperature range of 300-350° C. for 3-8 hours. In an independent embodiment, a composite target comprising $Li_2O$ and LiCl was prepared under a pressure of 20 MPa at 300° C. for 4 hours. In another independent embodiment, a composite target comprising $Li_2O$ and LiCl was annealed at 450° C. for 12 hours.

In some embodiments, the prepared composite target consists essentially of the starting precursors. As used herein, "consists essentially" means that (i) the target comprises at least 90 wt % of the starting precursors and (ii) the remaining components include any antiperovskite material formed during the annealing process and/or trace impurities (e.g., less than 3 wt % of components other than the starting precursors or the antiperovskite material formed from the precursors). Trace impurities may arise, for example, from impurities present in the starting precursors.

III. Antiperovskite Films

A general process of preparing antiperovskite films includes providing a pressed composite target of precursors as disclosed herein, and then subjecting the composite target to pulsed laser deposition to form an antiperovskite film. In some embodiments, the precursors are metal oxide(s) and metal halide(s). For example, $Li_3OCl$ films may be prepared from a pressed target that comprises at least 90 wt % of $Li_2O$ and LiCl with no more than 10 wt % of the $Li_3OCl$ antiperovskite, and then subjecting the target to pulsed laser deposition to form an antiperovskite film of $Li_3OCl$. The embodiment process provides an antiperovskite film having a conductivity that is at least as good as, and sometimes better than, conductivities of films prepared using a target composed entirely, or nearly entirely, of the antiperovskite itself, e.g., a target of $Li_3OCl$. In some embodiments, the process provides an antiperovskite $Li_3OCl$ film having a conductivity better than a $Li_3OCl$ prepared using a target composed of $Li_3OCl$.

The composite target is exposed to a pulsed laser beam under conditions suitable for deposition of a film of the antiperovskite material on the surface. In some embodiments, a KrF laser with a wavelength of 248 nm is used. The laser power may be ≥150 mJ. Frequency is not a critical parameter. Exemplary frequencies include, but are not limited to, frequencies within a range of 10-30 Hz.

In some embodiments, the pulsed laser deposition is performed in an atmosphere deficient in, or devoid of, oxygen. In one embodiment, pulsed laser deposition is performed in a vacuum, such as a vacuum of $10^{-4}$ to $10^{-5}$ torr. In an independent embodiment, pulsed laser deposition is performed under an argon atmosphere.

In some embodiments, an antiperovskite film is formed by pulsed laser deposition at a temperature within a range of 100-275° C., such as a temperature with a range of 150-275° C. In some working examples, the temperature was 175° C. or 265° C. Pulsed laser deposition is performed for an effective period of time to provide a film of the desired thickness. Suitable periods of time may range from several minutes to two or more hours, such as from 60-120 minutes.

Figure 1:
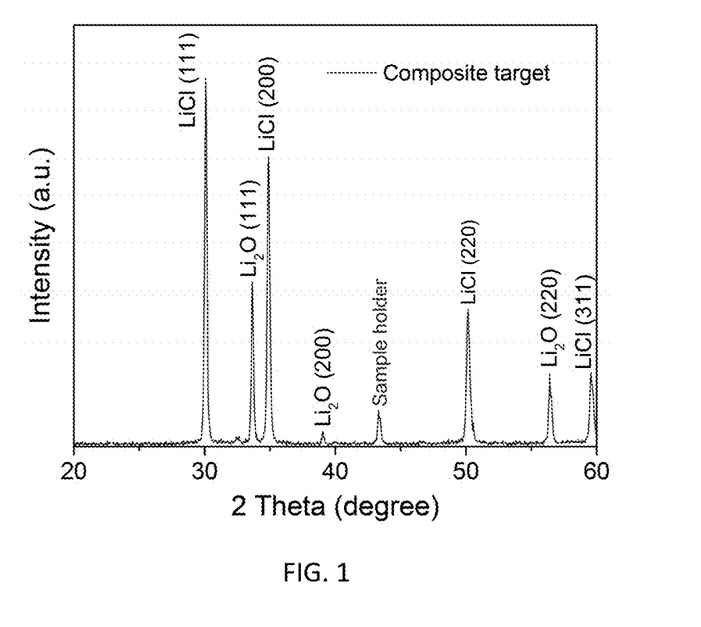
FIG. 1 shows an X-ray diffraction pattern of a pressed disk of $Li_2O$ and LiCl that was used as a target to deposit antiperovskite films of $Li_3OCl$. The major diffraction peaks are clearly those due to the $Li_2O$ and LiCl phases present in the target.
Figure 2:
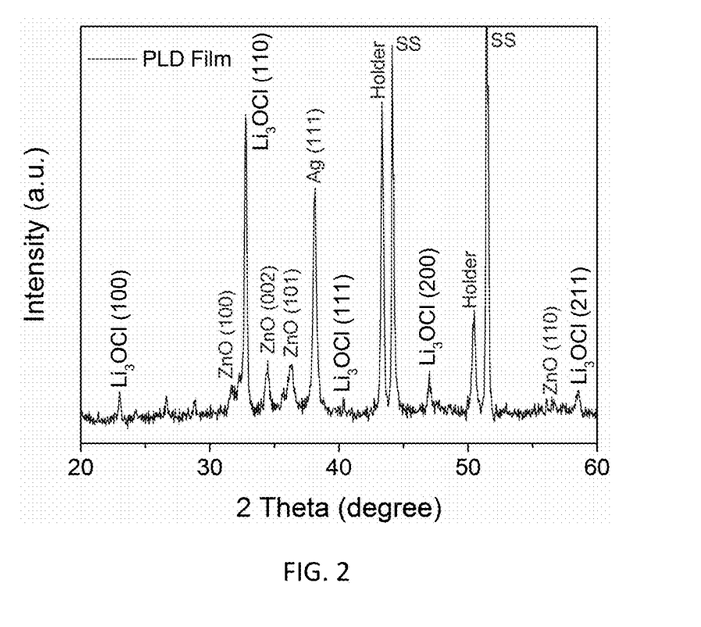
FIG. 2 shows an X-ray diffraction 2 theta scan of a $Li_3OCl$ film deposited on stainless steel by an embodiment of the process that employed a pressed target having the X-ray diffraction pattern shown in FIG. 1.

In some embodiments, the process disclosed herein is used for preparing antiperovskite films of the formula $Li_3OX$ where X is a halide. In certain embodiments, X is chloride. In examples disclosed herein for preparing an electrolyte film of $Li_3OCl$, a tiny peak at approximately 32.5 degrees on the x-ray diffraction pattern may indicate the presence of antiperovskite in the pressed annealed targets, but the x-ray diffraction pattern clearly indicates that the vast majority of the targets is composed of lithium oxide and lithium chloride based on the peak intensities, and only a tiny amount of the antiperovskite may be present in the targets (FIGS. 1 and 2). Despite the fact that the target includes mostly the precursors lithium oxide and lithium chloride, pulsed laser deposition of this target results in a film of the antiperovskite $Li_3OCl$. Thus, by choosing appropriate ratios of metal oxide and metal halide precursors that provide a ratio of atoms matching the ratio present in a desired antiperovskite, the present process may be used to prepare any desired antiperovskite starting with a target that is composed entirely or mainly of the starting precursor metal oxide(s) and metal halide(s).

The general process of preparing antiperovskite films from a pressed target of precursors also may be used for preparing antiperovskite films of the formula $Li_3OX_zY_{(1-z)}$ in which X and Y are halogens, and wherein $0 \le z \le 1$, such as $0 \le z \le 0.8$. In one embodiment, $0.1 \le z \le 0.8$. Some non-limiting values of z include, 0.10, 0.15, 0.20, 0.25, 0.30, 0.35, 0.40, 0.45, 0.50, 0.55, 0.60, 0.65, 0.70, and 0.80. In another embodiment, z has a value smaller than 0.10. Some non-limiting values of z that are less than 0.10 include 0.01, 0.02, 0.03, 0.04, 0.05, 0.06, 0.07, 0.08, and 0.09. These targets may be prepared using precursors $Li_2O$, LiX and LiY wherein X and Y are halogens (e.g. chloride, bromide, iodide, for example). The amounts of these precursors would be chosen to prepare the target based upon the formula of the desired antiperovskite compound. As one non-limiting example, an antiperovskite film having the formula $Li_3OCl_zBr_{(1-z)}$ (e.g., $Li_3OCl_{0.5}Br_{0.5}$) may be formed from a composite target comprising $Li_2O$, LiCl, and LiBr in desired ratios.

The general process for preparing antiperovskite films from a pressed target of precursors also may be used to prepare films of antiperovskite electrolytes having general formula $Li_{(3-x)}M_{x/2}OA$, wherein M is an alkaline earth cation, e.g., comprising or being selected from $Mg^{2+}$, $Ca^{2+}$, $Ba^{2+}$, $Sr^{2+}$, and combinations thereof, and A is one or more halide anions, e.g., comprising or being selected from fluoride, chloride, bromide, iodide, and combinations thereof. The value of x in the formula is less than or equal to 3, for example, $0 \leq x \leq 3$, $0 \leq x \leq 2$, $0 \leq x \leq 1$, or $0 \leq x \leq 0.8$. In one embodiment, $0.1 \leq x \leq 0.8$. Some non-limiting values of x include 0.10, 0.15, 0.20, 0.25, 0.30, 0.35, 0.40, 0.45, 0.50, 0.55, 0.60, 0.65, 0.70, and 0.80. In another embodiment, x has a value smaller than 0.10. Some non-limiting values of x that are less than 0.10 include 0.01, 0.02, 0.03, 0.04, 0.05, 0.06, 0.07, 0.08, and 0.09. The embodiment process for preparing these materials includes forming a target largely composed of the appropriate oxide precursors having atoms present in the same ratio as they are in the desired antiperovskite film. For each of these values of x, M is suitably an alkaline earth cation, or a mixture of alkaline earth cations, and A is a halide or mixture of halides. For example, A can be a mixture of chloride and bromide. A can be a mixture of chloride and fluoride. A can be a mixture of fluoride and chloride. A can be a mixture of chloride and bromide and iodide. It should be understood that A can be a mixture of halides, e.g., two, three, or even four halides. In one embodiment, an antiperovskite film is prepared by substitution of a portion of the starting precursor $Li_2O$ in the target with MgO to prepare a film of, for example, $Li_{2.8}Mg_{0.1}OCl$, which is also an antiperovskite. The replacement of some Li cations with Mg cations introduces vacancies in the antiperovskite crystal lattice that have been shown to produce higher ionic conductivities.

In an independent embodiment, the general process for preparing antiperovskite films from a pressed target of precursors may be used to prepare an antiperovskite film having the formula $Li_{(3-x)}Q_{x/3}OA$ wherein Q is a trivalent metal, wherein A is a halide (or combination of halides), and wherein $0 \leq x \leq 3$. For example, Q may be aluminum or boron. In some instances, Q may be Sc, Y, or a lanthanide; however, inclusion of these larger cations in significant amounts may distort or disrupt antiperovskite structure.

In another independent embodiment, the general process for preparing antiperovskite films from a pressed target of precursors may be used to prepare films of antiperovskite electrolytes having general formula $Li_{(3-x)}M_{x/2}OX_zY_{(1-z)}$ where M, X, Y, x, and z are as described above. In still another independent embodiment, the general process for preparing antiperovskite films from a pressed target of precursors may be used to prepare films of antiperovskite electrolytes having general formula $Li_{(3-x)}Q_{(x/3)}OX_zY_{(1-z)}$ where Q, X, Y, x, and z are as described above.

In lithium-rich electrolyte films that are antiperovskite films, it is believed that Li occupies the vertices of octahedra arranged in a cubic array with an oxygen atom at the octahedral centers. Halogens occupy the spaces between the octahedra. It is also believed for processes that make use of targets largely composed of precursors that replacement of a portion of a lithium precursor (e.g. lithium oxide, for example) with a precursor of an oxide of one or more divalent metals (e.g. magnesium oxide, calcium oxide, barium oxide, strontium oxide, or mixtures thereof) or with precursors that are oxides of trivalent metals (e.g. aluminum oxide) will introduce vacancies into the resulting antiperovskite material that would enhance ionic transport. Alternatively, a portion of the LiCl precursor can be replaced with a halide precursor of one or more divalent metals (e.g., magnesium chloride, calcium chloride, etc.). Alternatively, or in addition, using mixtures of halogens in the composite target permits a controlled distortion of the perovskite structure, which under some circumstances reduces hopping barriers and provides easier paths for ionic transport.

The average thickness of films prepared according to the present process may be, for example, in a range of from about 0.1 micrometers to about 20 micrometers or even about 1000 micrometers. Films and other features having an average thickness in the range of from about 10 micrometers to about 20 micrometers are considered particularly suitable, but films having other thicknesses may also be used.

It should be understood that other deposition techniques besides pulsed laser deposition that may employ a target for depositing a film also fall within the scope of this invention. Sputtering, for example, is a well-known technique that uses a target for depositing a film, and the energies for sputtering and for pulsed laser deposition are comparable. Therefore, an embodiment process for preparing a film of an antiperovskite material on a surface also comprises providing a target comprising a mixture of precursors, the ratio of atoms present in the precursors chosen to provide a desired ratio of atoms present in an antiperovskite material; and thereafter using the target to sputter a film of antiperovskite material onto a surface. The target would be prepared as described herein for the process involving the use of pulsed laser deposition.

In some embodiments, a multilayered film comprising an antiperovskite film layer is produced. For example, a tri-layered film having a metal/antiperovskite/metal configuration may be prepared. Suitable metals may include, but are not limited to, silver, gold, and lithium. The two metal layers may be the same metal or different metals. In one example, a tri-layered film comprising $Ag/Li_3OCl/Ag$ was prepared. In another example, a tri-layered film comprising $Li/Li_3OCl/Li$ was prepared.

Figure 3:
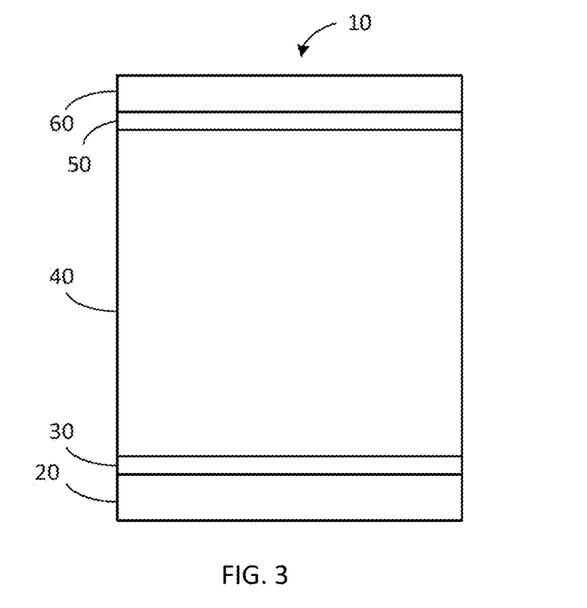
FIG. 3 shows a schematic drawing of a layered structure including a film of $Li_3OCl$ deposited by pulsed laser deposition from the pressed disk of $Li_2O$ and LiCl having the X-ray diffraction pattern of FIG. 1.

In certain embodiments, e.g., as shown in FIG. 3, a multilayered article 10 comprising an antiperovskite film layer is produced. A first layer of metal 30 is deposited onto a substrate 20 by any suitable means. Suitable substrates include, but are not limited to, insulating substrates, semiconducting substrates, and conductive substrates. Exemplary, non-limiting substrates include stainless steel, silicon, $LaAlO_3$, silica, and the like. Suitable metals include, but are not limited to, silver, gold, lithium, and the like. A composite target comprising the antiperovskite precursors as disclosed herein is exposed to a pulsed laser beam under suitable conditions to deposit an antiperovskite film 40 onto the metal layer 30. A second metal layer 50 subsequently is deposited onto the antiperovskite film 40 by any suitable means. The second metal layer 50 may comprise the same metal or a different metal than the first metal layer 30. In some embodiments, a protective layer 60, e.g., a metal oxide layer, is deposited onto the second metal layer 50. The protective layer 60 may prevent or minimize degradation from exposure to air. Suitable protective layers include metal oxides (e.g., ZnO, $TiO_2$, and the like). In some embodiments, the substrate 20 is stainless steel, the first and second metal layers 30, 50 are silver, gold, or lithium, the antiperovskite film 40 is $Li_3OCl$, and the protective layer 60 is ZnO.

IV. Examples

Materials:
$Li_2O$ powder (97% purity, ~60 mesh) and LiCl powder (99% purity) were purchased from Sigma-Aldrich Co. and used without further purification.

A target was prepared by mixing powders of $Li_2O$ and LiCl in a ratio of 1:1, pressing the powders into a disk under a pressure of 3000 psi, and annealing the disk in argon at 350° C. for 4 hours. An x-ray diffraction ("XRD") pattern of the pressed and annealed disk is shown in FIG. 1. The XRD pattern of FIG. 1 includes expected peaks for $Li_2O$ and LiCl, which indicates that the annealing step that was used to fuse the $Li_2O$ and LiCl powders together to form the target did not result in a chemical reaction between the $Li_2O$ and LiCl which would have converted the $Li_2O$ and LiCl to $Li_3OCl$. As used herein, fusing refers to heating a pressed powder under conditions sufficient to join powder particles together to form a single solid entity, such as a pressed disk. Any $Li_3OCl$ that may have formed is not present at a level high enough to be unambiguously identified in the XRD pattern.

Films of $Li_3OCl$ prepared from the pressed disks of $Li_2O$ and LiCl were deposited on a variety of substrates including $LaAlO_3$, Si, and stainless steel by pulsed laser deposition under a vacuum of $10^{-4}$ to $10^{-5}$ torr at 175° C. using a KrF laser (248 nm, 30 Hz).

Multilayer articles 10 (see, e.g., FIG. 3) including a tri-layer of silver/$Li_3OCl$/silver were prepared in order to measure the conductivity of the $Li_3OCl$ film. The process included depositing a layer 30 of silver on a substrate 20, afterwards exposing a target comprising a 1:1 mixture of $Li_2O$ and LiCl to a pulsed laser beam under conditions suitable for depositing a film 40 comprising antiperovskite $Li_3OCl$ on the first layer 30 of silver, and afterwards depositing a second layer 50 of silver on the layer 40 comprising antiperovskite $Li_3OCl$. A protective layer 60 (e.g. a metal oxide layer, such as a layer of ZnO, $TiO_2$, or the like) was deposited on the films to prevent film degradation from exposure to air. In this particular example, a protective layer of ZnO was deposited. The antiperovskite nature of the $Li_3OCl$ was verified by x-ray diffraction ("XRD"). An XRD pattern of the tri-layer of silver/$Li_3OCl$/silver after depositing the ZnO protective layer is shown in FIG. 2. The XRD pattern includes diffraction peaks for the stainless steel substrate, the silver layers, the ZnO protective layer, and for the antiperovskite $Li_3OCl$. The XRD pattern is devoid of any peaks that unambiguously indicate the presence of the precursors $Li_2O$ or LiCl.

Figure 4:
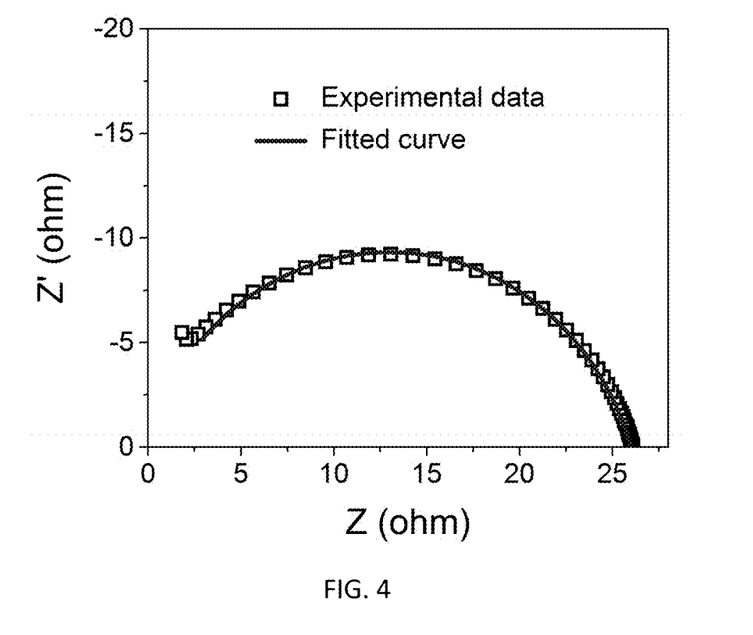
FIG. 4 shows an impedance spectrum of a tri-layer Ag/$Li_3OCl$ electrolyte/Ag film prepared using the pressed disk of $Li_2O$ and LiCl having the X-ray diffraction pattern shown in FIG. 1.

The ionic conductivity of the $Li_3OCl$ of the tri-layer was derived from AC impedance spectra. The spectra were obtained using an electrochemical system (PARSTAT 2273, Princeton Applied Research) that provided impedance measurements in a frequency range of 100 Hz to 4 MHz with an amplitude of 10 mV. A typical impedance spectrum measured at room temperature is shown in FIG. 4. The value for the ionic conductivity was $2 \times 10^{-4}$ S/cm at room temperature. This value is better than the values for ionic conductivity for films of $Li_3OCl$ prepared from a $Li_3OCl$ target. In some examples, a corresponding tri-layer article was constructed using a compound target of $Li_3OCl$ (or $Li_2OHCl$).

Figure 5:
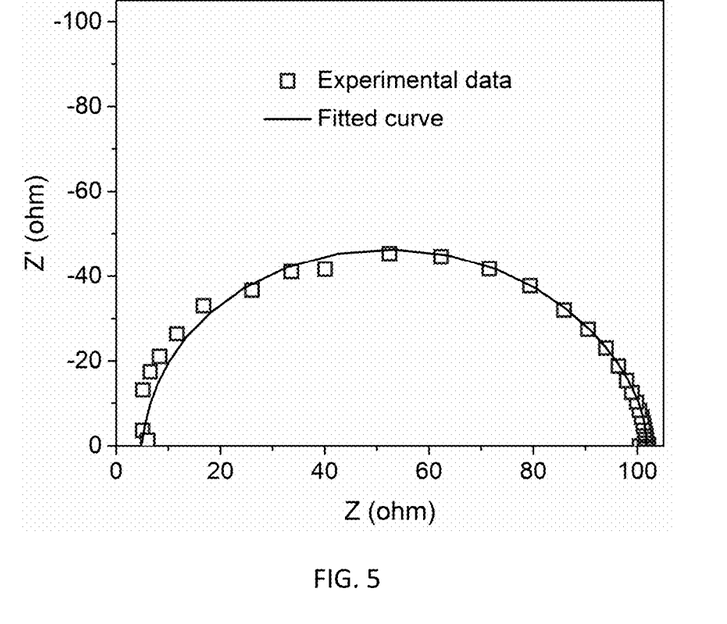
FIG. 5 shows an impedance spectrum of a tri-layer Ag/$Li_3OCl$ electrolyte/Ag film prepared using a compound target of $Li_3OCl$.

An impedance spectrum is shown in FIG. 5. The value for the ionic conductivity was $0.9 \times 10^{-5}$ S/cm.

Figure 6:
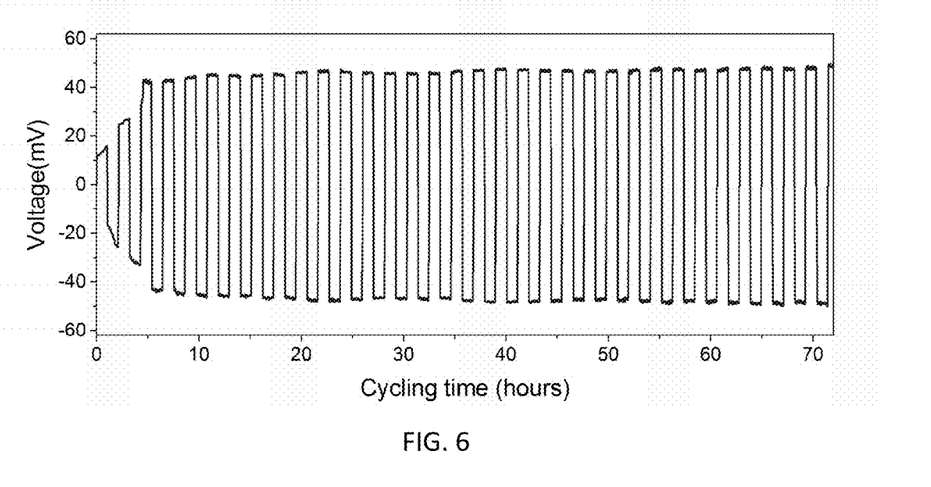
FIG. 6 shows cyclability of a trilayer Li/$Li_3OCl$/Li film tested at a current of 100 μA and room temperature. The voltage increase during cycling tests in the first few cycles is due to an increase in resistance; no significant voltage increase can be observed thereafter.

FIG. 6 provides information about the stability of the voltage of a trilayer Li/$Li_3OCl$/Li film at a current of 100 μA and room temperature. FIG. 6 shows that the voltage increased due to an increase in resistance during cycling tests for the first few cycles. After the first two cycles, however, no significant voltage increase was observed.

In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the following claims. We therefore claim as our invention all that comes within the scope and spirit of these claims.

What is claimed is:

1. A process comprising:
   preparing a film of an antiperovskite material on a surface by
      providing a target comprising a mixture of precursors, the mixture having a ratio of atoms present in the precursors chosen to provide a desired ratio of atoms present in an antiperovskite material; and
      exposing the target thereafter to a pulsed laser beam under conditions suitable for deposition of atoms present in the target onto a surface to form the antiperovskite material.

2. The process of claim 1, wherein providing the target comprises:
   compressing the mixture of precursors into a pressed object; and
   annealing the pressed object under temperature and time conditions that do not convert more than 10 wt % of the mixture of precursors into the antiperovskite material prior to exposing the target to the pulsed laser beam.

3. The process of claim 2, wherein the antiperovskite material has the formula $Li_3OX_zY_{(1-z)}$, wherein X and Y are halogens, and wherein $0 \leq z \leq 1$.

4. The process of claim 3, wherein $0.1 \leq z \leq 0.8$.

5. The process of claim 3, wherein $0 \leq z < 0.10$.

6. The process of claim 2, wherein the antiperovskite material has the formula $Li_{(3-x)}M_{x/2}OA$, wherein:
   $0 \leq x \leq 3$;
   M is an alkaline earth metal; and
   A is a halide or a combination of halides.

7. The process of claim 6, wherein the alkaline earth metal is $Mg^{2+}$, $Ca^{2+}$, $Ba^{2+}$, $Sr^{2+}$, or a combination thereof.

8. The process of claim 6, wherein the halide anions are fluoride, chloride, bromide, iodide or a combination thereof.

9. The process of claim 6, wherein $0.1 \leq x \leq 0.8$.

10. The process of claim 6, wherein $0 \leq x < 0.10$.

11. The process of claim 2, wherein the antiperovskite material has the formula $Li_{(3-x)}Q_{(x/3)}OA$ wherein $0.1 \leq x \leq 3$, wherein Q is a trivalent metal, and wherein A is one or more halide anions.

12. The process of claim 11, wherein Q is aluminum.

13. The process of claim 11, wherein the halide anions are fluoride, chloride, bromide, iodide, or a combination thereof.

14. The process of claim 11, wherein $0.1 \leq x \leq 0.8$.

15. The process of claim 11, wherein $0 \leq x < 0.10$.

16. A process comprising:
   preparing a film of $Li_3OCl$ by the steps of
      forming a target comprising at least 90 wt % of a mixture of $Li_2O$ and LiCl, the mixture having a molar ratio of $Li_2O$:LiCl within a range of 0.9:1.1 to 1.1:0.9; and exposing the target thereafter to a pulsed laser beam under conditions suitable for depositing a film comprising $Li_3OCl$ on a surface.

17. The process of claim 16, wherein the step of forming the target comprises:
   forming a powder mixture of $Li_2O$ and LiCl, the powder mixture having a molar ratio of $Li_2O$:LiCl within a range of 0.9:1.1 to 1.1:0.9;
   pressing the powder mixture into a disk having a structure; and
   annealing the disk under conditions suitable for physically stabilizing the disk without converting more than 10 wt % of the powder mixture into $Li_3OCl$ prior to exposing the target to the pulsed laser beam.

18. A process for preparing a multilayered article comprising:
   depositing a first layer of metal on a substrate;
   exposing a target comprising a mixture of $Li_2O$ and LiCl, the mixture having a molar ratio of $Li_2O$:LiCl within a range of 0.9:1.1 to 1.1:0.9, to a pulsed laser beam under conditions suitable for depositing a film comprising antiperovskite $Li_3OCl$ on the first layer of metal;
   depositing a second layer of metal on the film comprising antiperovskite $Li_3OCl$; and
   depositing a protective layer on the second layer of metal.

19. The process of claim 18, further comprising forming a target consisting essentially of the mixture of $Li_2O$ and LiCl before exposing the target to the pulsed laser beam.

20. The process of claim 19, wherein forming the target comprises:
   forming a powder mixture of $Li_2O$ and LiCl;
   pressing the powder mixture into a disk; and
   annealing the disk under conditions suitable for fusing the powders together to form the target without converting more than 10 wt % of the mixture of precursors into the antiperovskite material prior to exposing the target to the pulsed laser beam.

* * * * *